United States Patent
Teguri et al.

(10) Patent No.: US 10,937,629 B2
(45) Date of Patent: Mar. 2, 2021

(54) MULTI CHARGED PARTICLE BEAM WRITING APPARATUS AND MULTI CHARGED PARTICLE BEAM WRITING METHOD

(71) Applicant: NuFlare Technology, Inc., Yokohama (JP)

(72) Inventors: Hironori Teguri, Yamato (JP); Jun Yashima, Yokohama (JP); Yasuo Kato, Yokohama (JP); Masafumi Ise, Yokosuka (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 16/594,130

(22) Filed: Oct. 7, 2019

(65) Prior Publication Data
US 2020/0118791 A1    Apr. 16, 2020

(30) Foreign Application Priority Data
Oct. 11, 2018    (JP) .............................. JP2018-192684

(51) Int. Cl.
*H01J 37/317*    (2006.01)
*H01J 37/302*    (2006.01)
*H01J 37/04*    (2006.01)

(52) U.S. Cl.
CPC ........ *H01J 37/3177* (2013.01); *H01J 37/045* (2013.01); *H01J 37/3026* (2013.01);
(Continued)

(58) Field of Classification Search
CPC ...... H01J 37/30; H01J 37/3002; H01J 37/302; H01J 37/3023; H01J 37/3026; H01J 37/3174; H01J 37/3177
(Continued)

(56) References Cited

U.S. PATENT DOCUMENTS

2012/0292536 A1*  11/2012  Yashima ................ B82Y 10/00
                                                 250/492.22
2013/0264497 A1   10/2013  Muraki et al.
(Continued)

FOREIGN PATENT DOCUMENTS

JP    2011-171510 A    9/2011
JP    2013-219085 A   10/2013
(Continued)

OTHER PUBLICATIONS

Taiwanese Office Action dated Nov. 25, 2020 in counterpart Taiwanese Patent Application No. 108130992 (with English translation), 14 pages.
(Continued)

*Primary Examiner* — Jason L McCormack
(74) *Attorney, Agent, or Firm* — Oblon, McClelland, Maier & Neustadt, L.L.P.

(57) ABSTRACT

In one embodiment, a first storage storing writing data, a second storage storing correction data for correcting an error in a writing position due to factors including bending of the substrate, a cell data allocator virtually dividing a writing region of the substrate into blocks, and allocating a cell to the blocks in consideration of the correction data, a plurality of bitmap data generators virtually dividing the blocks into meshes, calculating an irradiation amount per mesh region, and generating bitmap data which assigns the irradiation amount to each mesh region, and a shot data generator generating shot data that defines an irradiation time for each beam. The cell data allocator virtually divides the writing region by division lines in a direction different from a writing forward direction to generate a plurality of division regions. The plurality of bitmap data generators generate pieces of bitmap data of the different division regions.

12 Claims, 5 Drawing Sheets

(52) U.S. Cl.
CPC .............. *H01J 2237/31754* (2013.01); *H01J 2237/31764* (2013.01)

(58) Field of Classification Search
USPC .............................. 250/492.1, 492.2, 492.22
See application file for complete search history.

(56) References Cited

U.S. PATENT DOCUMENTS

| | | | |
|---|---|---|---|
| 2014/0231668 A1* | 8/2014 | Yasuda | H01J 37/045 250/396 R |
| 2015/0294836 A1 | 10/2015 | Inoue | |
| 2015/0362834 A1* | 12/2015 | Choi | G03F 1/78 716/53 |
| 2016/0349626 A1 | 12/2016 | Matsumoto | |
| 2018/0005799 A1 | 1/2018 | Hasegawa et al. | |

FOREIGN PATENT DOCUMENTS

| | | |
|---|---|---|
| JP | 2015-201576 A | 11/2015 |
| JP | 2016-225357 A | 12/2016 |
| JP | 2017-102280 A | 6/2017 |
| JP | 2018-006604 A | 1/2018 |
| JP | 2018-37579 A | 3/2018 |
| KR | 10-2018-0004671 A | 1/2018 |
| TW | 201812461 A | 4/2018 |

OTHER PUBLICATIONS

Korean Office Action dated Dec. 12, 2020 in counterpart Korean Patent Application No. 10-2019-0117510 (with English translation), 10 pages.

* cited by examiner

FIG.7F

MULTI CHARGED PARTICLE BEAM WRITING APPARATUS AND MULTI CHARGED PARTICLE BEAM WRITING METHOD

CROSS REFERENCE TO RELATED APPLICATION

This application is based upon and claims benefit of priority from the Japanese Patent Application No. 2018-192684, filed on Oct. 11, 2018, the entire contents of which are incorporated herein by reference.

FIELD

The present invention relates to a multi charged particle beam writing apparatus and a multi charged particle beam writing method.

BACKGROUND

With an increase in the integration density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

A writing apparatus using multi beams can irradiate with a greater number of beams at once, as compared with when writing is performed with a single electron beam, thus the throughput can be significantly improved. In a multi beam writing apparatus that uses a blanking plate as one form of multi beam writing apparatus, for instance, electron beams discharged from an electron gun pass through a shaping aperture array having multiple openings, and multi beams (multiple electron beams) are formed. The multi beams each pass through a corresponding one of the blankers of the blanking plate. Each of the blankers performs blanking deflection on passing electron beams. An electron beam deflected by a blanker is blocked, and an electron beam not deflected by a blanker is emitted on a specimen.

In a multi beam writing apparatus, a writing region is virtually divided into blocks, and writing data in a cell hierarchy is allocated to the blocks. Each block is further virtually divided into meshes, and a figure developed from the writing data in a cell hierarchy is assigned to mesh regions. An irradiation amount per mesh region is determined from an area density of a figure arranged to each mesh region, and bitmap data that assigns the irradiation amount to each mesh region is generated. The multi beam writing apparatus performs processing of the blocks by parallelized multiple computing machines, and generates bitmap data.

An error in a writing position occurs due to bending or the like of a substrate which is a writing target placed on a stage. A region for which bitmap data is generated by each computing machine was made greater than a block region in consideration of a displacement amount of cell associated with correction of the error. For this reason, bitmap data generation regions corresponding to adjacent blocks have an overlapped portion.

For instance, a case is considered where first to fourth computing machines generate bitmap data for blocks B1 to B4 shown in FIG. 7A. As shown in FIG. 7B, the first computing machine generates bitmap data for a region R1 including the block B1. As shown in FIG. 7C, the second computing machine generates bitmap data for a region R2 including the block B2. As shown in FIG. 7D, the third computing machine generates bitmap data for a region R3 including the block B3.

The bitmap data generation region R1 generated by the first computing machine and the bitmap data generation region R2 generated by the second computing machine have an overlapped region D1 as shown by a shaded portion in FIG. 7E. For the overlapped region D1, calculation for generation of bitmap data is redundantly performed by the first computing machine and the second computing machine.

The bitmap data generation region R1 generated by the first computing machine and a bitmap data generation region R3 generated by the third computing machine have an overlapped region D2 as shown by a shaded portion in FIG. 7F. For the overlapped region D2, calculation for generation of bitmap data is redundantly performed by the first computing machine and the third computing machine. As shown in FIG. 7E and FIG. 7F, the bitmap data generation region R1 generated by the first computing machine includes an overlap with a bitmap data generation region generated by another computing machine in each of x direction and y direction.

Such redundancy in bitmap data generation calculation between multiple computing machines has been preventing reduction in processing data volume.

BRIEF DESCRIPTION OF THE DRAWINGS

FIGS. 7A to 7F are illustrations explaining data processing in a comparative example.

DETAILED DESCRIPTION

In one embodiment, a multi charged particle beam writing apparatus includes a movable stage on which a substrate is placed as a writing target, a discharger discharging a charged particle beam, a shaping aperture array substrate in which a plurality of openings are formed, and which forms multi beams by allowing the charged particle beam to pass through the plurality of openings, a blanking plate including a plurality of blankers which perform blanking deflection on each beam of the multi beams, a first storage storing writing data including a figure type and arrangement coordinates of a figure to be written, a second storage storing correction data for correcting an error in a writing position due to factors including bending of the substrate, a cell data allocator virtually dividing a writing region of the substrate into a plurality of blocks, reading the writing data, and allocating a cell including at least one figure to the plurality of blocks in consideration of the correction data, a plurality of bitmap data generators virtually dividing the blocks into meshes, calculating an irradiation amount per mesh region from an area density of a figure arranged in each of mesh regions, and generating bitmap data which assigns the irradiation amount to each mesh region, and a shot data generator generating shot data that defines an irradiation time for each beam, using the bitmap data generated by the plurality of bitmap data generators, and transferring the shot data to the blanking plate. The cell data allocator virtually divides the writing region by division lines in a direction different from a writing forward direction to generate a plurality of division regions. The plurality of bitmap data generators generate pieces of bitmap data of the different division regions.

An embodiment of the present invention will be described below on the basis of the drawings. In the present embodiment, a configuration using electron beams as an example of charged-particle beams is described. However, charged-particle beams are not limited to electron beams, and may be beams using charged particles, such as ion beams.

Figure 1:
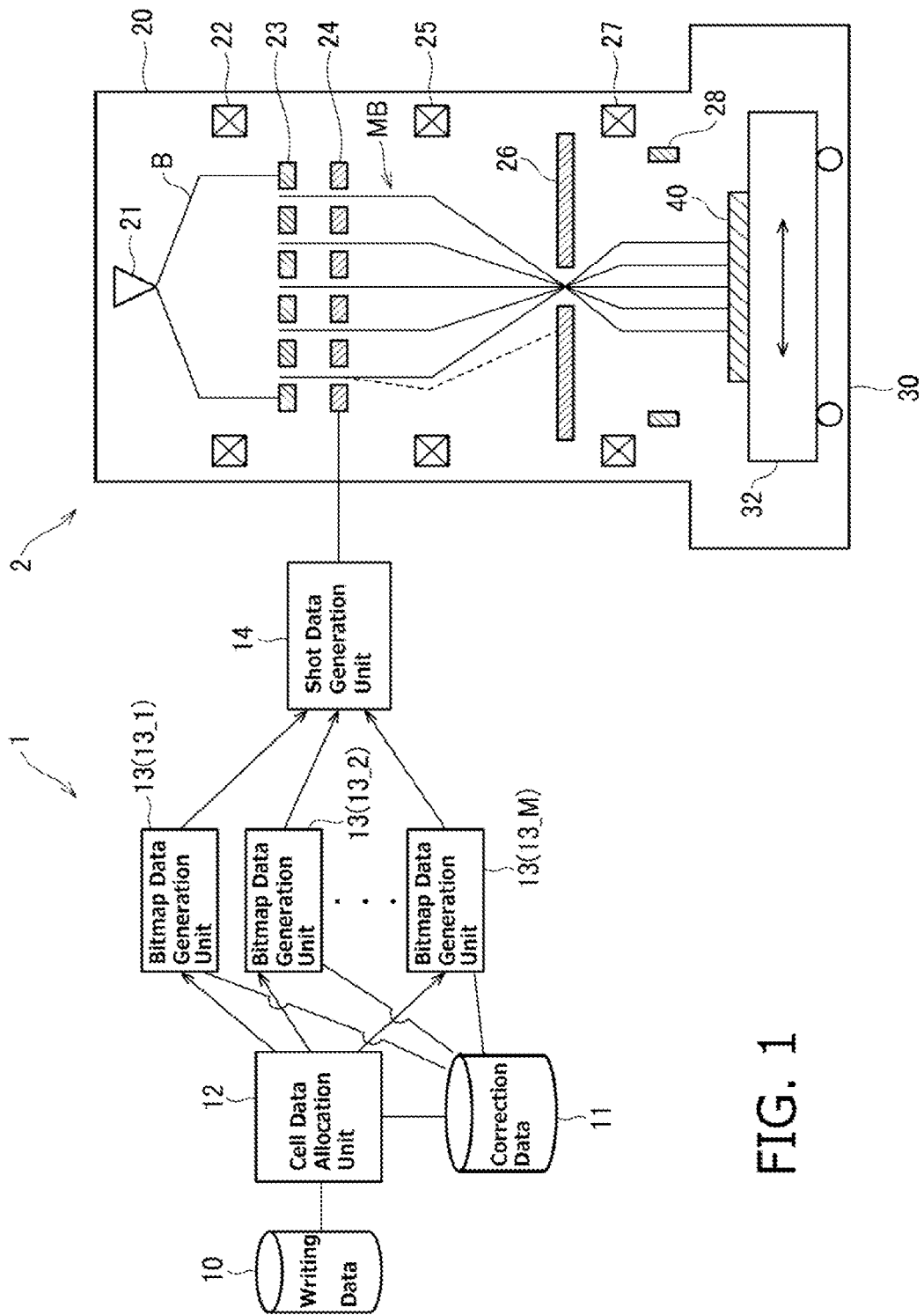
FIG. 1 is a schematic diagram of a writing apparatus according to an embodiment of the present invention.

FIG. 1 is a schematic configuration diagram of a writing apparatus according to the present embodiment. The writing apparatus includes a control unit 1 and a writing unit 2. The writing apparatus is an example of a multi charged particle beam writing apparatus. The writing unit 2 includes a column 20 and a writing chamber 30. In the column 20, an electron gun 21, an illumination lens 22, a shaping aperture array substrate 23, a blanking plate 24, a reducing lens 25, a limiting aperture member 26, an objective lens 27, and a deflector 28 are disposed. The reducing lens 25 and the objective lens 27 are both comprised of an electromagnetic lens, and a reducing optical system is comprised of the reducing lens 25 and the objective lens 27.

An XY stage 32 is placed in the writing chamber 30. A substrate 40 which is a writing target is placed on the XY stage 32. The substrate 40 is a mask for exposure when a semiconductor device is manufactured, a semiconductor substrate (silicon wafer) on which a semiconductor device is manufactured, or mask blanks on which resist is coated and nothing has been written.

The control unit 1 includes storage devices 10, 11 such as a magnetic disk device, a cell data allocation unit 12 (a cell data allocator), multiple bitmap data generation units 13 (13_1 to 13_M), and a shot data generation unit 14 (a shot data generator). The multiple bitmap data generation units 13 (bitmap data generators) are provided in parallel between the cell data allocation unit 12 and the shot data generation unit 14. The cell data allocation unit 12, the multiple bitmap data generation units 13, and the shot data generation unit 14 are each comprised of separate hardware such as a computing machine (computer) including an electrical circuit. For instance, the bitmap data generation units 13_1 to 13_M each include one CPU. The cell data allocation unit 12 and each bitmap data generation unit 13 are coupled via a bus or a network. Also, each bitmap data generation unit 13 and the shot data generation unit 14 are coupled via a bus or a network.

In FIG. 1, the components necessary for explaining the present embodiment are illustrated. Illustration of other publicly known components necessary for the operation of the writing apparatus is omitted.

In the shaping aperture array substrate 23, holes (openings) in m rows and n columns (m, n≥2) are formed in a matrix with predetermined arrangement pitches. The holes are all formed in a rectangular shape or a circular shape having the same dimensions.

An electron beam B discharged from the electron gun 21 illuminates the entire shaping aperture array substrate 23 almost perpendicularly by the illumination lens 22. The electron beam B passes through multiple holes of the shaping aperture array substrate 23, thereby forming electron beams (multi beams) MB in m rows and n columns.

In the blanking plate 24, passage holes are formed in alignment with the arrangement positions of the holes of the shaping aperture array substrate 23. A set of two electrodes (a blanker, a blanking deflector) as a pair is disposed at each passage hole. An amplifier that applies a voltage is disposed at one of the electrodes for each beam, and the other is grounded. An electron beam which passes through each passage hole is independently deflected by a voltage applied to the two electrodes as a pair. Blanking control is performed on each beam by the deflection of the electron beam.

The multi beams MB, which have passed through the blanking plate 24, are reduced by the reducing lens 25, and proceed to a central hole formed in the limiting aperture member 26. An electron beam deflected by a blanker of the blanking plate 24 is displaced from the central hole of the limiting aperture member 26, and is blocked by the limiting aperture member 26. On the other hand, an electron beam not deflected by a blanker passes through the central hole of the limiting aperture member 26.

In this manner, the limiting aperture member 26 blocks each beam which is deflected by a blanker so as to achieve a beam OFF state. The beam, which has passed through the limiting aperture member 26 in a period from beam ON until beam OFF is achieved, forms the beam for one shot.

The multi beams MB, which have passed through the limiting aperture member 26, are focused by the objective lens 27 to form a pattern image having a desired reduction ratio, and are collectively deflected by the deflector 28 and emitted to the substrate 40. For instance, when the XY stage 32 is continuously moved, the irradiation position of each beam is controlled by the deflector 28 so as to follow the movement of the XY stage 32.

The multi beams emitted at once are ideally arranged with a pitch which is obtained by multiplying the arrangement pitch of the multiple holes of the shaping aperture array substrate 23 by the above-mentioned desired reduction ratio. The writing apparatus performs a writing operation by the raster scan method by which a shot beam is continuously emitted sequentially, and when a desired pattern is written, a necessary beam is controlled beam ON by blanking control according to the pattern.

Figure 2:
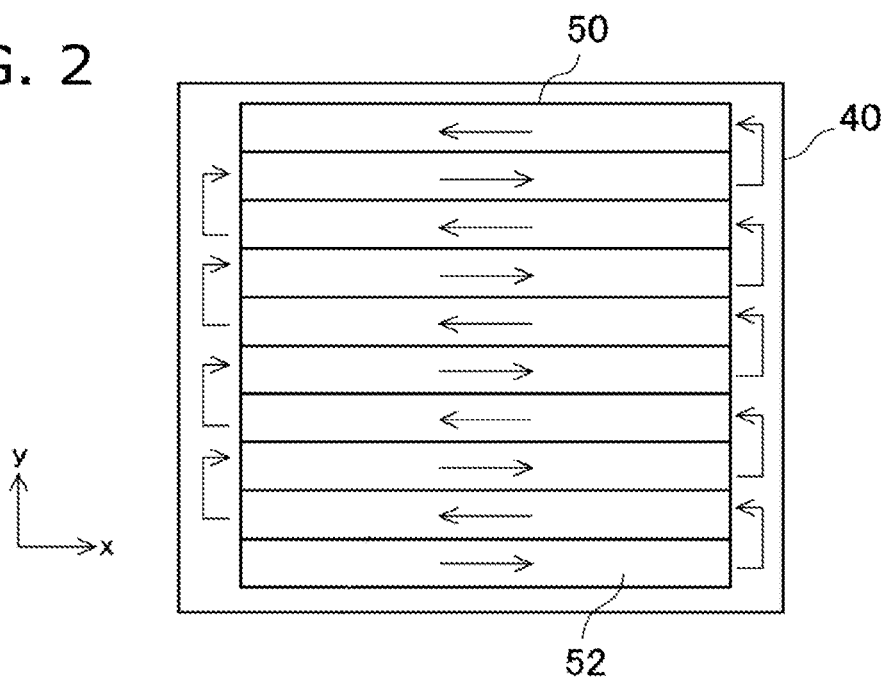
FIG. 2 is an illustration explaining an example of a writing operation.

As shown in FIG. 2, the writing region 50 of the substrate 40 is virtually divided into multiple stripe regions 52 in a reed shape with a predetermined width in y direction, for instance. Each of the stripe regions 52 is a unit region for writing. For instance, an irradiation region is adjusted to be positioned at the left end of the first stripe region 52 by moving the XY stage 32, and writing is started, the irradiation region being able to be irradiated by one-time irradiation with the multi beams MB. The writing can be proceeded in relatively x direction by moving the XY stage 32 in −x direction.

After the writing on the first stripe region 52, the stage position is moved in −y direction so that the irradiation region is adjusted to be positioned at the right end of the second stripe region 52, and writing is started. Writing is performed in −x direction by moving the XY stage 32 in x direction, for instance.

In the third stripe region 52, writing is performed in x direction, in the fourth stripe region 52, writing is performed in −x direction, and performing writing while alternately changing the direction in this manner enables the writing time to be reduced. However, without being limited to the case where writing is performed while alternately changing the direction, when writing is performed on each stripe region 52, the writing may be proceeded in the same direction.

In multi beam writing, the writing region 50 is virtually divided into meshes having a beam size. A pattern is written by irradiating each mesh including a figure pattern with a beam, and not irradiating any mesh including no figure pattern with a beam. When an end of a figure pattern is positioned in a mesh, the position of the end of the figure pattern is controlled by adjusting the irradiation amount.

The irradiation amount is controlled by the irradiation time of each beam of the multi beams. Shot data is generated by the shot data generation unit 14, and is provided to the blanking plate 24, the shot data being beam control data that defines the irradiation positions, irradiation times and sequences of irradiation beams. Each blanker of the blanking plate 24 performs blanking control on each beam based on the shot data, and adjusts the irradiation amount (irradiation time).

Next, a method of generating the shot data will be described.

The storage device 10 stores writing data. The writing data defines, for instance, the arrangement coordinates, figure type, figure size and the like of a figure pattern. The writing data is hierarchized, and includes a figure hierarchy, and a cell hierarchy including at least one figure.

The storage device 11 stores correction data for correcting an error in the writing position due to factors including bending of the substrate 40. The correction data includes polynomial data which approximates a positional error within the surface of the substrate 40, and map data for correcting a residual error which cannot be corrected by a polynomial.

Figure 3:
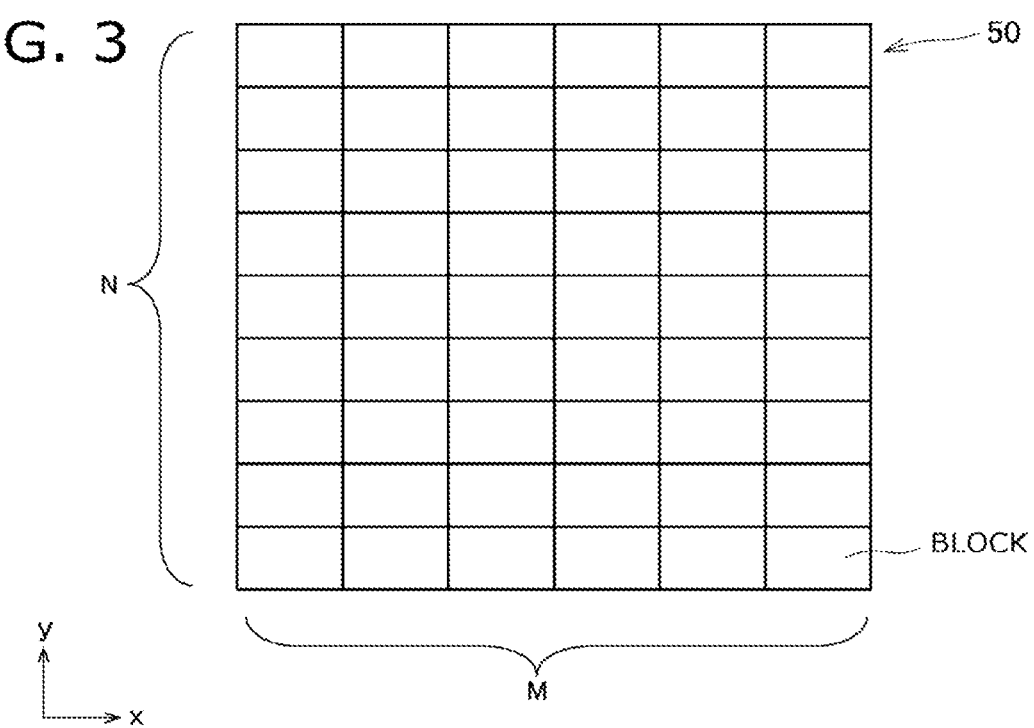
FIG. 3 is an illustration showing an example in which a writing region is virtually divided into blocks.

The cell data allocation unit 12 virtually divides the writing region 50 into blocks. For instance, as shown in FIG. 3, the writing region is virtually divided so that M pieces of blocks in x direction (writing forward direction), and N pieces of blocks in y direction perpendicular to x direction are arranged (M, N 2). For instance, the writing region 50 is virtually divided in y direction with the width of the above-described stripe region 52, each stripe region is virtually divided in x direction with a predetermined width, and multiple blocks are obtained.

The cell data allocation unit 12 virtually divides the writing region 50 so that the blocks equivalent in number to the bitmap data generation units 13 are arranged in x direction, for instance. In that case, the number M of blocks is the number of the bitmap data generation units 13.

The cell data allocation unit 12 reads writing data from the storage device 10, and allocates cells (writing data in a cell hierarchy) to the blocks. Here, the cell data allocation unit 12 reads correction data from the storage device 11, adds a displacement amount (position correction amount) based on polynomial correction and map correction to cell arrangement coordinates, and allocates the cells to the blocks.

The cell data allocation unit 12 transfers cell information allocated to a block to a bitmap data generation unit 13 corresponding to the block.

Figure 4:
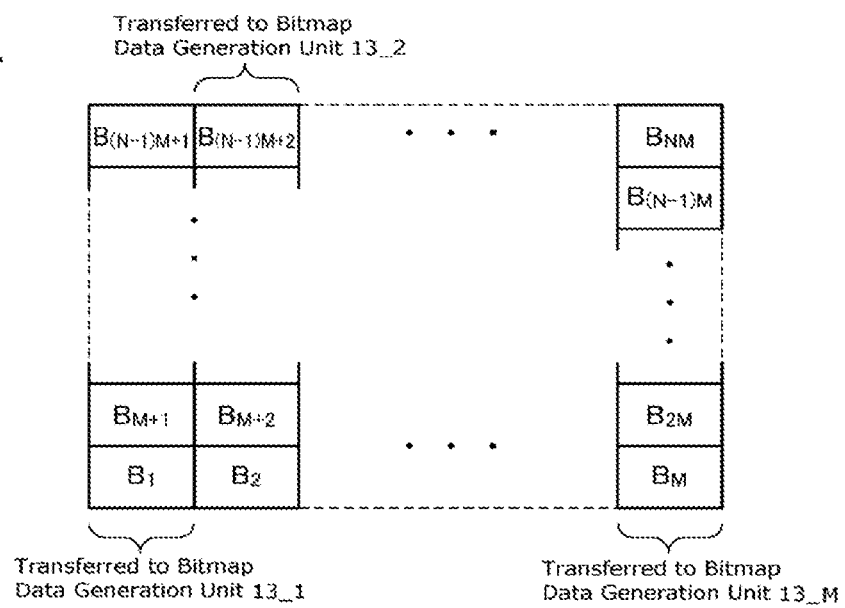
FIG. 4 is an illustration explaining the data processing region of each bitmap data generation unit.

For instance, as shown in FIG. 4, a case is considered where the writing region is virtually divided into blocks $B_1$ to $B_{NM}$, M pieces in x direction, and N pieces in y direction. The cell data allocation unit 12 transfers cell information for regions to the bitmap data generation unit 13_1, the regions corresponding to the blocks among the blocks $B_1$, $B_{M+1}$, $B_{2M+1}$, ... $B_{(N-1)M+1}$ and included in the stripes of the writing target. The cell data allocation unit 12 transfers cell information for regions to the bitmap data generation unit 13_2, the regions corresponding to the blocks among the blocks $B_2$, $B_{M+2}$, $B_{2M+2}$, ... $B_{(N-1)M+2}$ and included in the stripes of the writing target. Similarly, the cell data allocation unit 12 transfers cell information for regions to the bitmap data generation unit 13_M, the regions corresponding to the blocks among the blocks $B_M$, $B_{2M}$, $B_{3M}$, ... $B_{NM}$ and included in the stripes of a writing target.

The bitmap data generation unit 13 further virtually divides each block into meshes, and assigns a figure developed from the cell data to mesh regions. The bitmap data generation unit 13 determines from the area density of a figure arranged in each of the mesh regions an irradiation amount per mesh region, and generates bitmap data which assigns the irradiation amount to each mesh region.

Figure 5:
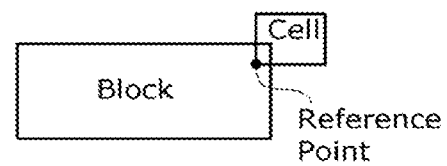
FIG. 5 is an illustration showing an example in which a cell runs over a block.

As shown in FIG. 5, when the reference point of a cell is positioned at an end of a block, the cell runs over the block. For this reason, the width of a region for which bitmap data is generated by one bitmap data generation unit 13 is obtained by adding the range of running over of the cell size to the width of the block.

Figure 6A:
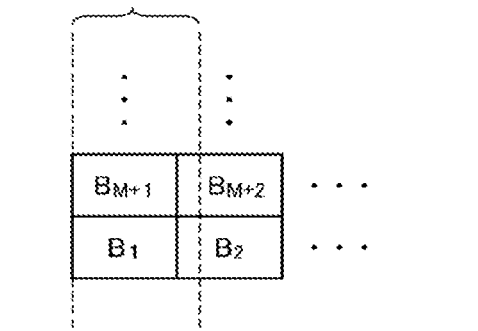
FIGS. 6A and 6B are illustrations showing an example of a bitmap data generation region.
Figure 6B:
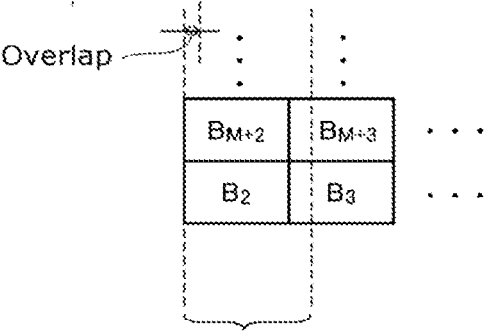

FIGS. 6A and 6B show an example of bitmap generation regions (division regions) generated by the bitmap data generation units 13_1, 13_2. The +x side-end of a bitmap generation region generated by the bitmap data generation units 13_1 overlaps with the −x side-end of a bitmap generation region generated by the bitmap data generation units 13_2. However, there is no overlap in y direction with any bitmap generation region computed by another computing machine, thus redundant processing data volume between the bitmap data generation units 13 can be reduced.

Figure 7A:
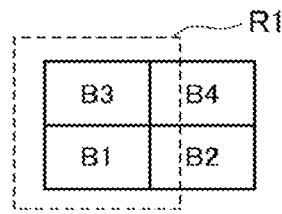
Figure 7B:
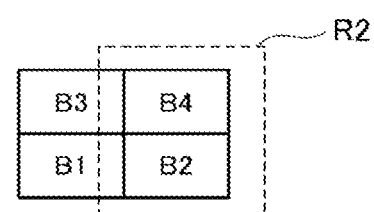
Figure 7C:
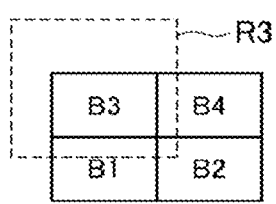
Figure 7D:
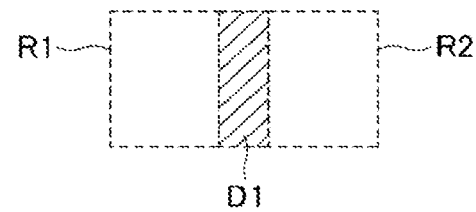
Figure 7E:
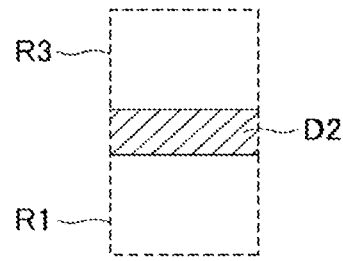

Also, the bitmap generation regions R1 to R3 shown in FIGS. 7B to 7D have a large width in x direction because a cell displacement amount when correcting an error in the writing position due to bending of the substrate is taken into consideration. In contrast, in the present embodiment, a displacement amount (position correction amount) based on polynomial correction and map correction is added to the cell arrangement coordinates, and cells are allocated to the blocks. Thus, only the range of running over of the cell size needs to be considered, and the width in x direction of the bitmap generation region processed by one bitmap data generation unit 13 can be reduced. Therefore, it is possible to reduce the overlap of the bitmap generation regions in x direction between the bitmap data generation units 13, and reduce redundant processing data volume between the bitmap data generation units 13.

The multiple bitmap data generation units 13 (13_1 to 13_M) transfer the generated bitmap data to the shot data generation unit 14. The shot data generation unit 14 generates shot data using the bitmap data, and transfers the shot data to the blanking plate 24.

As described above, in the present embodiment, the writing region 50 is virtually divided into multiple division regions in a direction perpendicular to the writing forward direction (x direction), and one division region is processed by one bitmap data generation unit. Thus, the bitmap data generation regions do not overlap in y direction between different bitmap data generation units, and the processing data volume can be reduced.

Also, since a displacement amount (position correction amount) based on the polynomial correction and the map correction is added to the cell arrangement coordinates, and cells are allocated to the blocks, it is possible to reduce the overlap of the bitmap generation regions in x direction between the bitmap data generation units 13, and reduce redundant processing data volume between the bitmap data generation units 13.

Consequently, the capacity of a buffer memory which stores the calculation data, and the data transfer volume between the bitmap generation units 13 and the shot data generation unit 14 can be reduced, and the throughput of writing processing can be improved.

The cell data allocation unit 12 may calculate displacement (translation, rotation) amounts corresponding to the zero-order terms and the first-order terms in the polynomial (for instance, cubic functions and quartic functions) of the correction data, may move the block regions, and may allocate cells. Thus, the range of blocks which cover a chip can be decreased, and the processing data volume can be further reduced.

In the above-described embodiment, limitation is imposed on the example such that the writing region 50 is virtually divided by division lines in a direction perpendicular to the writing forward direction (x direction) to generate multiple division regions. However, without being limited to the perpendicular direction, the writing region may be virtually divided in a direction different from the writing forward direction.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
   a movable stage on which a substrate is placed as a writing target;
   a discharger discharging a charged particle beam;
   a shaping aperture array substrate in which a plurality of openings are formed, and which forms multi beams by allowing the charged particle beam to pass through the plurality of openings;
   a blanking plate including a plurality of blankers which perform blanking deflection on each beam of the multi beams;
   a first storage storing writing data including a figure type and arrangement coordinates of a figure to be written;
   a second storage storing correction data for correcting an error in a writing position due to factors including bending of the substrate;
   a cell data allocator virtually dividing a writing region of the substrate into a plurality of blocks, reading the writing data, and allocating a cell including at least one figure to the plurality of blocks in consideration of the correction data;
   a plurality of bitmap data generators virtually dividing the blocks into meshes, calculating an irradiation amount per mesh region from an area density of a figure arranged in each of mesh regions, and generating bitmap data which assigns the irradiation amount to each mesh region; and
   a shot data generator generating shot data that defines an irradiation time for each beam, using the bitmap data generated by the plurality of bitmap data generators, and transferring the shot data to the blanking plate,
   wherein the cell data allocator virtually divides the writing region by division lines in a direction different from a writing forward direction to generate a plurality of division regions, and
   the plurality of bitmap data generators generate pieces of bitmap data of the different division regions.

2. The apparatus according to claim 1, wherein the cell data allocator virtually divides the writing region into the division regions which are equivalent in number to the bitmap data generators.

3. The apparatus according to claim 1, wherein the cell data allocator virtually divides the writing region by division lines in a direction perpendicular to a writing forward direction, and generates the division regions which are equivalent in number to the bitmap data generators.

4. The apparatus according to claim 1, wherein an end of a first division region for which a first bitmap data generator generates bitmap data and an end of second division region for which a second bitmap data generator generates bitmap data in the writing forward direction are overlapped by a width based on a size of the cell.

5. The apparatus according to claim 1, wherein the cell data allocator moves the blocks based on the correction data, and allocates cells to the blocks after being moved.

6. The apparatus according to claim 1, wherein the cell data allocator moves an arrangement of the cell based on the correction data, and allocates cells to the blocks.

7. A multi charged particle beam writing method by which writing is performed by irradiating a substrate with multi beams formed of a charged particle beam, the method comprising:
   reading writing data including a figure type and arrangement coordinates of a figure to be written from a first storage,
   reading correction data for correcting an error in a writing position due to factors including bending of the substrate from a second storage;
   virtually dividing a writing region of the substrate into a plurality of blocks, and allocating a cell including at least one figure to the plurality of blocks;
   virtually dividing the blocks into meshes using a plurality of bitmap data generators, calculating an irradiation amount per mesh region from an area density of a figure arranged in each of mesh regions, and generating bitmap data which assigns the irradiation amount to each mesh region;
   generating shot data that defines an irradiation time for each beam, using the bitmap data generated by the plurality of bitmap data generators;
   transferring the shot data to a blanking plate including a plurality of blankers corresponding to beams of the multi beams; and
   performing blanking deflection on corresponding beams based on the shot data by the plurality of blankers,
   wherein the cell is allocated to the plurality of blocks based on the correction data,
   the writing region is virtually divided by division lines in a direction different from a writing forward direction to generate a plurality of division regions, and
   pieces of bitmap data of different division regions are generated by the plurality of bitmap data generators.

8. The method according to claim 7,
wherein the writing region is divided into the division regions which are equivalent in number to the bitmap data generators.

9. The method according to claim 7,
wherein the writing region is virtually divided by division lines in a direction perpendicular to a writing forward direction, and the division regions, which are equivalent in number to the bitmap data generators, are generated.

10. The method according to claim 7,
wherein an end of a first division region for which a first bitmap data generator generates bitmap data and an end of a second division region for which a second bitmap data generator generates bitmap data in the writing forward direction are overlapped by a width based on a size of the cell.

11. The method according to claim 7,
wherein the blocks are moved based on the correction data, and cells are allocated to the blocks after being moved.

12. The method according to claim 7,
wherein an arrangement of the cell is moved based on the correction data, and cells are allocated to the blocks.

* * * * *